United States Patent
Rajendran et al.

(10) Patent No.: US 9,385,901 B2
(45) Date of Patent: Jul. 5, 2016

(54) RECEIVER FRONT END ARCHITECTURE FOR INTRA BAND CARRIER AGGREGATION

(71) Applicant: QUALCOMM Incorporated, San Diego, CA (US)

(72) Inventors: Gireesh Rajendran, Bangalore (IN); Gurkanwal Singh Sahota, San Diego, CA (US); Rakesh Kumar, Ghazipur (IN)

(73) Assignee: QUALCOMM INCORPORATED, San Diego, CA (US)

( * ) Notice: Subject to any disclaimer, the term of this patent is extended or adjusted under 35 U.S.C. 154(b) by 8 days.

(21) Appl. No.: 14/540,900

(22) Filed: Nov. 13, 2014

(65) Prior Publication Data

US 2016/0142231 A1     May 19, 2016

(51) Int. Cl.
| | |
|---|---|
| *H03F 3/04* | (2006.01) |
| *H04L 27/26* | (2006.01) |
| *H04L 27/00* | (2006.01) |
| *H04L 5/00* | (2006.01) |
| *H03F 1/26* | (2006.01) |
| *H03F 1/22* | (2006.01) |
| *H03F 3/68* | (2006.01) |
| *H03F 3/72* | (2006.01) |
| *H03F 1/30* | (2006.01) |
| *H03F 1/32* | (2006.01) |

(52) U.S. Cl.
CPC ............ *H04L 27/0002* (2013.01); *H03F 1/223* (2013.01); *H03F 1/26* (2013.01); *H03F 1/301* (2013.01); *H03F 1/3205* (2013.01); *H03F 3/68* (2013.01); *H03F 3/72* (2013.01); *H04L 5/0042* (2013.01); *H04L 27/2649* (2013.01)

(58) Field of Classification Search
CPC .................... H03F 2200/294; H03F 2200/372; H03F 2200/492; H03F 1/301; H03F 1/3205; H03F 1/26; H03F 2203/45554; H03F 2203/45638; H03F 2203/45662; H03F 2203/45731; H03F 3/45179; H03F 1/223; H03F 1/22; H03F 1/523; H04L 1/0045; H04L 25/03171; H04L 25/03178; H04L 25/03331; H04L 25/061; H04L 25/067; H04L 27/2649; H04L 27/0002; H04L 5/0042; H03M 13/37; H03M 5/02

See application file for complete search history.

(56) References Cited

U.S. PATENT DOCUMENTS

| | | | | |
|---|---|---|---|---|
| 6,636,119 | B2 * | 10/2003 | Vathulya | H03F 1/223 330/296 |
| 6,725,030 | B2 * | 4/2004 | Vathulya | H03F 1/301 455/252.1 |
| 6,784,741 | B1 | 8/2004 | Redman-White | |
| 7,095,281 | B2 | 8/2006 | Zipper et al. | |
| 7,420,425 | B2 * | 9/2008 | Tsai | H03F 1/223 330/311 |
| 7,656,229 | B2 * | 2/2010 | Deng | H03F 1/223 330/149 |
| 7,696,828 | B2 * | 4/2010 | Chang | H03F 1/223 330/283 |
| 7,701,289 | B2 | 4/2010 | Kuo et al. | |
| 7,936,220 | B2 | 5/2011 | Li et al. | |
| 8,975,968 | B2 * | 3/2015 | Abdelhalem | H03F 1/22 330/311 |
| 2007/0229154 | A1 | 10/2007 | Kim et al. | |
| 2010/0237947 | A1 | 9/2010 | Xiong et al. | |
| 2013/0315348 | A1 | 11/2013 | Tasic et al. | |
| 2014/0253242 | A1 | 9/2014 | Youssef et al. | |

OTHER PUBLICATIONS

International Search Report and Written Opinion—PCT/US2015/053286—ISAEPO—Jan. 18, 2016.

* cited by examiner

*Primary Examiner* — Vibol Tan
(74) *Attorney, Agent, or Firm* — Procopio, Cory, Hargreaves & Savitch, LLP

(57) ABSTRACT

A receiver front end architecture for intra band carrier aggregation is disclosed. In an exemplary embodiment, an apparatus includes a first transistor having a gate terminal to receive an input signal, drain terminal to output an amplified signal, and a source terminal connected to a signal ground by a source degeneration inductor. The apparatus also includes a second transistor having a source terminal connected to the drain terminal of the first transistor and a drain terminal connected to a first load. The apparatus also includes a third transistor having a gate terminal connected to the drain terminal of the first transistor, a drain terminal connected to a second load and a source terminal connected to a signal ground.

19 Claims, 6 Drawing Sheets

| Configuration | $S_A$ | $S_B$ | $S_1$ | $SE_1$ |
|---|---|---|---|---|
| Input signal output to Main Load | 1 | 1 | 0 | 0 |
| Input signal output to both Main and first Loads | 1 | 0 | 0 | 1 |
| First load signal input to main load | 0 | 0 | 1 | 0 |
| | | | | |

RECEIVER FRONT END ARCHITECTURE FOR INTRA BAND CARRIER AGGREGATION

BACKGROUND

I. Field

The present disclosure relates generally to electronics, and more specifically to configurable routing of radio frequency signals in a wireless device.

II. Background

A wireless device (e.g., a cellular phone or a smartphone) in a wireless communication system may transmit and receive data for two-way communication. For example, the wireless device may operate in a frequency division duplexing (FDD) system or in a time division duplexing system (TDD). The wireless device may include a transmitter for data transmission and a receiver for data reception. For data transmission, the transmitter may modulate a radio frequency (RF) carrier signal with data to obtain a modulated RF signal, amplify and filter the modulated RF signal to obtain an amplified RF signal having the proper output power level, and transmit the amplified RF signal via an antenna to a base station. For data reception, the receiver may obtain a received RF signal via the antenna and may amplify, filter and process the received RF signal to recover data sent by the base station.

A wireless device may support operation over a wide frequency range. For example, the wireless device may operate in a carrier aggregation (CA) communication system in which the device includes a front end that receives multiple downlink (DL) carrier signals over a wide frequency range. The front end operates to amplify and route the received carrier signals to the appropriate demodulators for demodulation. Unfortunately, conventional front ends may utilize multiple amplifiers with each amplifier having a degeneration inductor. The large size of these inductors means the conventional front end utilizes significant circuit area. Also, if the amplifiers used to amplify the multiple carrier signals are spread across multiple chips, it may be difficult to compensate for various gain and circuit routing losses that may be incurred.

It is therefore desirable to have a front end architecture that provides efficient amplification and routing of received signals in a carrier aggregation receiver. The front end should operate to maintain excellent linearity, provide compensation for gain and routing losses, and reduce or minimize circuit area requirements over conventional front ends.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

A novel receiver front end architecture providing configurable RF signal amplification and routing in a device to demodulate multiple carrier signals over a wide frequency range covering multiple band groups is disclosed herein. The receiver front end architecture is suite for use in various types of electronic devices such as wireless communication devices.

Figure 1:
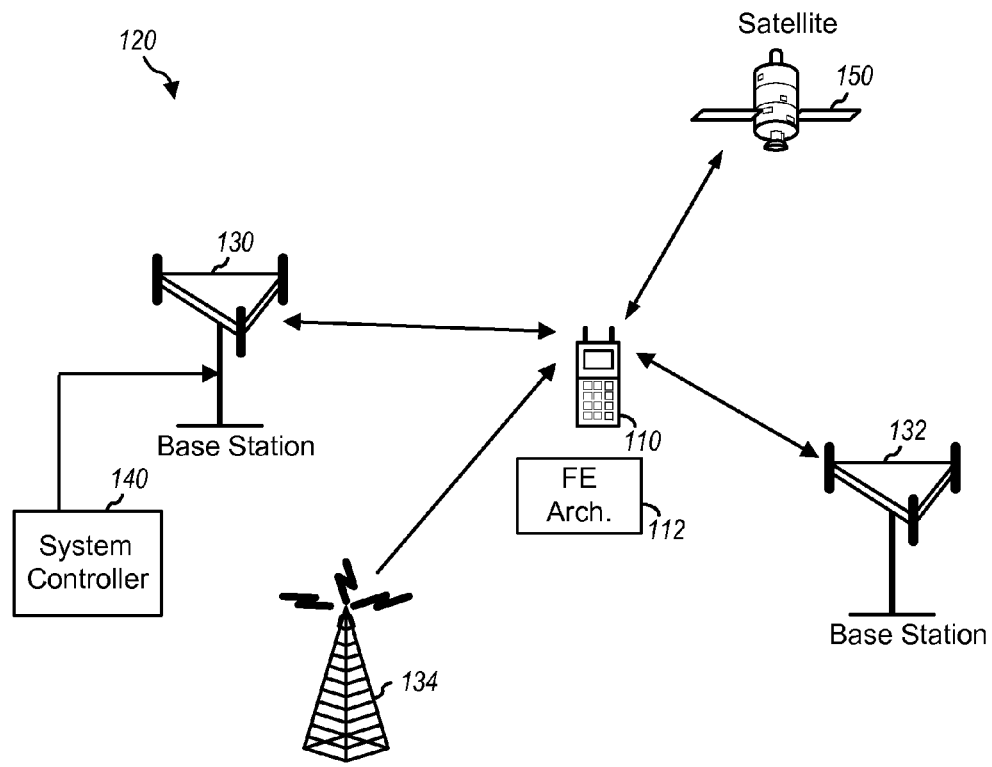
FIG. 1 shows an exemplary embodiment of a front end architecture for use in a wireless device communicating within a wireless system.

FIG. 1 shows an exemplary embodiment of front end architecture 112 for use in a wireless device 110 communicating within a wireless system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless system 120 including two base stations 130 and 132 and one system controller 140. In general, wireless system 120 may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with devices in the wireless system 120. Wireless device 110 may also receive signals from broadcast stations (e.g., a broadcast station 134), or signals from satellites (e.g., a satellite 150) in one or more global navigation satellite systems (GNSS). Wireless device 110 may support one or more radio technologies for wireless communication such as LTE, WCDMA, CDMA 1x, EVDO, TD-SCDMA, GSM, 802.11. In an exemplary embodiment, the wireless device 110 comprises the receiver front end (FE) architecture 112 to provide RF carrier signal amplification and routing when receiving multiple carriers in a carrier aggregation communication system. The FE 112 is designed to utilize fewer amplifier degeneration inductors to reduce circuit area requirements and to provide better compensation for gain/routing losses over conventional front end designs.

Figure 2:
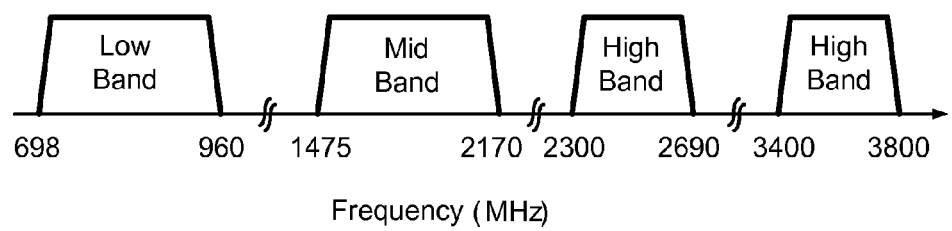
FIG. 2 shows three exemplary band groups in which exemplary embodiments of the front end architecture shown in FIG. 1 may operate.

FIG. 2 shows three exemplary band groups in which exemplary embodiments of the FE 112 shown in FIG. 1 may operate. Wireless device 110 may operate in a low-band (LB) covering frequencies lower than 1000 megahertz (MHz), a mid-band (MB) covering frequencies from 1000 MHz to 2300 MHz, and/or a high-band (HB) covering frequencies higher than 2300 MHz. For example, the low-band may cover 698 to 960 MHz, the mid-band may cover 1475 to 2170 MHz, and the high-band may cover 2300 to 2690 MHz and 3400 to 3800 MHz, as shown in FIG. 2. The low-band, mid-band, and high-band refer to three groups of bands (or band groups), with each band group including a number of frequency bands (or simply, "bands"). Each band may cover up to 200 MHz. LTE Release 11 supports 35 bands, which are referred to as LTE/UMTS bands and are listed in 3GPP TS 36.101.

In general, any number of band groups may be defined. Each band group may cover any range of frequencies, which may or may not match any of the frequency ranges shown in FIG. 2. Each band group may also include any number of bands. In various exemplary embodiments, the FE 112 is suitable for use to receive, amplify and demodulate carrier signals in any of the frequency bands in which the device 110 may operate.

Figure 3:
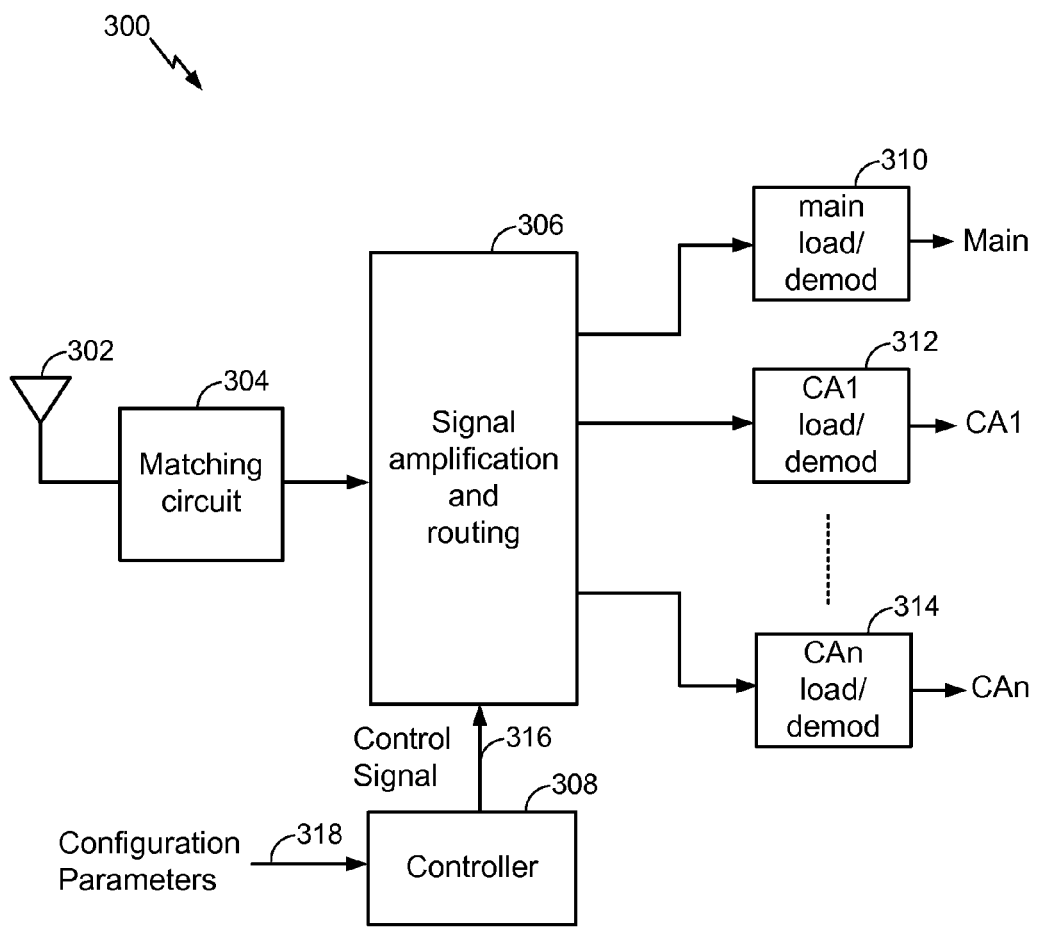
FIG. 3 shows a receiver that includes an exemplary embodiment of a front end architecture that provides configurable RF signal amplification and routing.

FIG. 3 shows a receiver 300 that includes an exemplary embodiment of a front end architecture that provides configurable RF signal path amplification and routing. For example, the receiver 300 is suitable for use to amplify and route received carrier signals in a carrier aggregation communication system. The receiver 300 includes receive antenna 302, matching circuit 304, Signal Amplification and Routing Circuit (SARC) 306, controller 308, main load circuit 310, a first Carrier Aggregation ("CA1") load circuit 312, one or more additional Carrier Aggregation load circuits (not shown), and an $n^{th}$ carrier aggregation ("CAn") load circuit 314. In an exemplary embodiment, each load circuit 310-314 includes a separate demodulation circuit.

During operation, an RF signal is received by the receive antenna 302. For example, the RF signal may include any of the bands and/or band groups illustrated in FIG. 2. The received RF signal is routed by the SARC 306 to any combination of output loads 310-314 according to control signals 316 provided to the SARC 306 from controller 308. In an exemplary embodiment, the control signals 316 are set to first logic voltage levels for a first signal path routing configuration and the control signals 316 are set to second logic voltage levels for a second signal path routing configuration.

Although not illustrated in FIG. 3, controller 308 can be dynamically programmed by a baseband processor within the wireless device. For example, the baseband processor provides configuration parameters 318 to the controller 308 to program the operation of the controller 308. In an exemplary embodiment, a baseband processor included in the wireless device will use the controller 308 to change the signal routing of the received RF signal depending on the mode of carrier aggregation in which the wireless device is operating.

Figure 4:
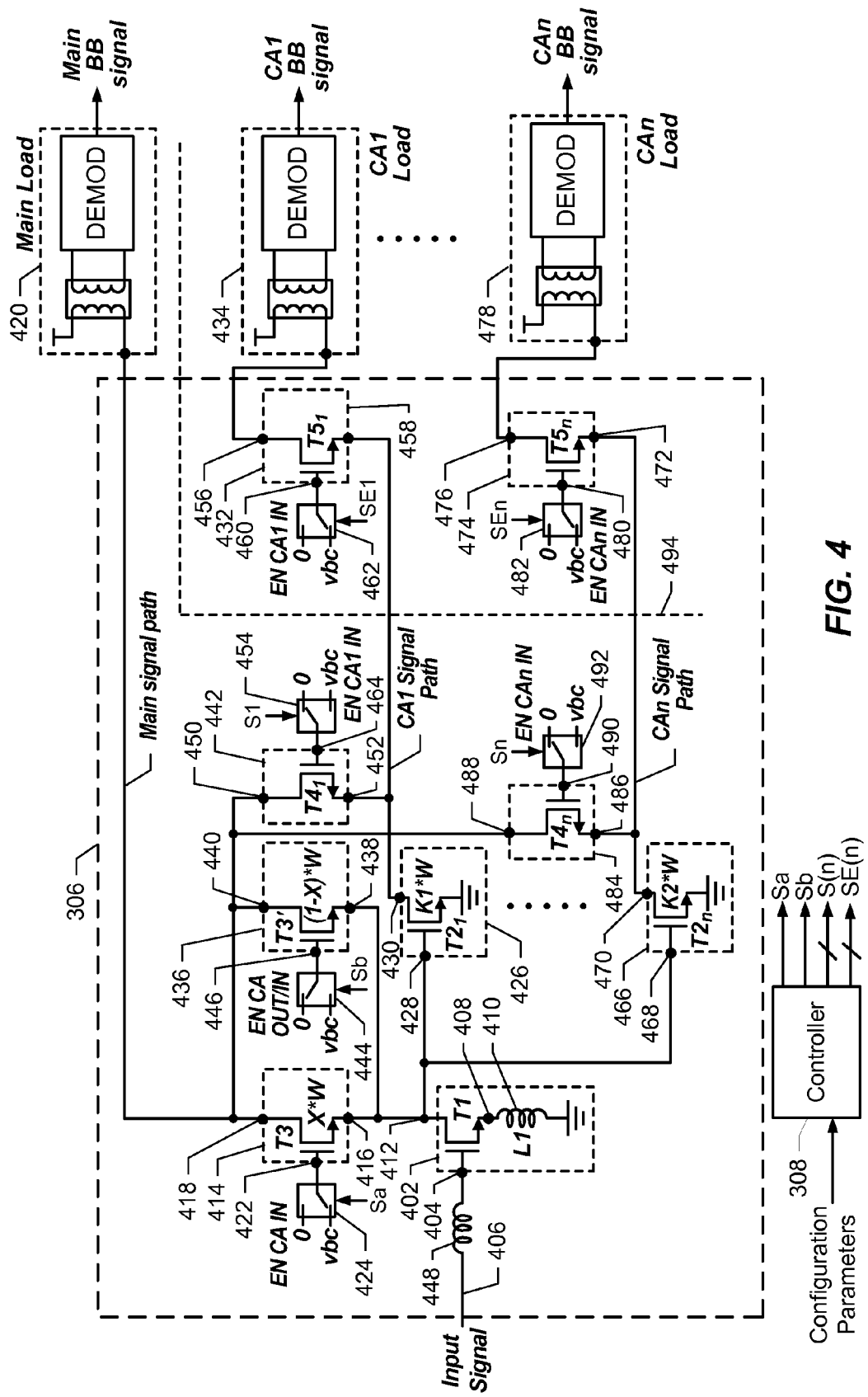
FIG. 4 shows a detailed exemplary embodiment of the front end architecture shown in FIG. 3.

FIG. 4 shows a detailed exemplary embodiment of the SARC 306 used in the front end architecture shown in FIG. 3. The SARC 306 includes a first common source amplifier 402 comprising transistor (T1) having a gate terminal 404 to receive an input signal 406 through inductor 448, a source terminal 408 connected to a source degeneration inductor 410 that is further connected to a signal ground, and a drain terminal 412 to output an amplified version of the input signal. Thus, the first common source amplifier 402 is implemented using transistor T1 and source degeneration inductor L1.

The SARC 306 also includes a first cascode amplifier 414 comprising transistor (T3) having a source terminal 416 connected to the drain terminal 412, and a drain terminal 418 connected to a main load 420 by a main signal path. The first cascode amplifier 414 also includes a gate terminal 422 selectively connected to a voltage level (vbc) by switch 424. Thus, the first cascode amplifier 414 is implemented using transistor T3. The switch 424 receives control signal Sa from the controller 308, which controls the switch 424 to selectively input a zero voltage level or a vbc voltage level to the gate terminal 422. In an exemplary embodiment, the vbc voltage level is typically 1.2 volts. In another exemplary embodiment, the vbc voltage level is set to bias any of the transistor devices to any desired bias setting or for DC coupling.

The SARC 306 further includes a second common source amplifier 426 comprising transistor ($T2_1$) having a gate terminal 428 connected to the drain terminal 412 and a drain terminal 430 connected to a source terminal 458 of switch 432 by a CA1 signal path. The switch 432 comprises transistor ($T5_1$) and has a drain terminal 456 connected to a second load 434. Thus, the second common source amplifier 426 is implemented using transistor $T2_1$. It should be noted that the second common source amplifier 426 is configured without a source degeneration inductor unlike the first common source amplifier 402, which uses the source degeneration inductor 410. Thus, the source terminal of the transistor $T2_1$ is connected directly to the signal ground. The switch 432 includes a gate terminal 460 that is selectively connected to the voltage level vbc by switch 462.

The SARC 306 also includes a second cascode amplifier 436 comprising transistor (T3') having a source terminal 438 connected to the first drain terminal 412 and a drain terminal 440 connected to the drain terminal 418 of the transistor T3 and to a drain terminal 450 of switch 442. The second cascode amplifier 436 has a gate terminal 446 that is selectively connected to the voltage level vbc by switch 444. Thus, the second cascode amplifier 436 is implemented using transistor T3'. In an exemplary embodiment, the first cascode amplifier 414 is configured to conduct more current than the second cascode amplifier 436, which is accomplished by appropriate sizing of the transistors T3 and T3' to achieve the desired current conduction characteristics. The switch 442 comprises transistor ($T4_1$), which includes a source terminal 452 that is connected to the CA1 signal path and thereby is connected to the drain terminal 430 of the transistor $T2_1$ and the source terminal 458 of the transistor $T5_1$. The switch 442 includes a gate terminal 464 that is selectively connected to the voltage level vbc by switch 454. In an exemplary embodiment, the transistor T3 is split into transistors (T3+T3') so that in carrier aggregation mode, the transistor T3' can be switched off to increase the impedance seen at the drain of transistor T1. This increases the gain at the drain of transistor T1, which is the input to transistors (T2n). This aids in reducing the noise contribution from transistors (T2n).

In addition amplifying and routing the received RF signal to the main load 420 and the CA1 load 434, the SARC 306 is configurable to amplify and route the received RF signal to any number of additional CA loads. The following is a description of the configuration of the SARC 306 to amplify and route the received RF signal to the $n^{th}$ CA load. It should be noted that similar circuit structures can be used for amplifying and routing the received RF signal to any number of CA loads between the first CA load and the $n^{th}$ CA load.

The SARC 306 includes an $n^{th}$ common source amplifier 466 comprising the transistor ($T2_n$) having a gate terminal 468 connected to the drain terminal 412 and a drain terminal 470 connected to a source terminal 472 of switch 474 by a $CA_n$ signal path. The switch 474 comprises transistor ($T5_n$) and has a drain terminal 476 connected to an $n^{th}$ load 478. Thus, the $n^{th}$ common source amplifier 466 is implemented using transistor $T2_n$. It should be noted that the additional common source amplifiers up to and including the $n^{th}$ common source amplifier 466 do not utilize a source degeneration inductor like the first common source amplifier 402, which uses the degeneration inductor 410. The switch 474 includes a gate terminal 480 that is selectively connected to a voltage level (vbc) by switch 482.

The SARC 306 includes a switch 484 comprising transistor ($T4_n$) that has a source terminal 486 connected to the $CA_n$ signal path and thereby connects to the drain terminal 470 and the source terminal 472. A drain terminal 488 of the switch 484 is connected to the drain terminal 418. A gate terminal 490 of the switch 484 is selectively connected to the voltage level vbc by switch 492.

During operation, the controller 308 generates a plurality of control signals. In an exemplary embodiment, each control signal is either a logic-low voltage level or a logic-high voltage level. The control signal "Sa" output from the controller 308 is coupled to switch 424 and controls the voltage level at the gate terminal 422 of transistor T3. When the control signal "Sa" is a logic-low voltage level, a zero volt signal is input to the gate terminal 422 and the first cascode amplifier 414 is turned off. As a result, the input signal 406 is not coupled to the drain terminal 418 through transistor T3. Alternatively, when the control signal "Sa" is a logic-high voltage level, a vbc voltage level is input to the gate terminal 422 and the first cascode amplifier 414 is turned on. As a result, the input signal 406 is coupled to the drain terminal 418 through transistor T3. The signal at drain terminal 418 then passes through the main signal path to the main load 420. At the main load 420, the signal is coupled through a transformer to a demodulator that demodulates the signal based on a selected local oscillator signal to generate a main baseband (BB) signal.

A control signal "Sb" generated by the controller 308 is coupled to control the switch 444, which controls the voltage level at the gate terminal 446 of transistor T3'. When the control signal "Sb" is a logic-low voltage level, the switch 444 inputs zero volts into the gate terminal 446 and the second cascode amplifier 436 is turned off so that the amplified input signal at terminal 412 is not coupled to the drain terminal 440 of transistor T3'. Alternatively, when the control signal "Sb" is a logic-high voltage level, the switch 444 inputs vbc volts to the gate terminal 446 so that the second cascode amplifier 436 is turned on. As a result, the amplified input signal at terminal 412 is coupled to the drain terminal 440 of transistor T3' and to the main signal path.

The control signals "S(n)" are generated by the controller 308. The signal S1 is coupled to control the switch 454 associated with the CA1 signal path. The control signals S(n) also are coupled to control additional corresponding switches associated with additional signal paths. For example, the signal $S_n$ is coupled to control the switch 492 associated with the $CA_n$ signal path. Thus, the control signals S(n) control the voltage levels at the gate terminals of corresponding transistors T4(n) in the CA signal paths. For example, when the control signal "S1" is a logic-low voltage level, the switch 442 is turned off (i.e. open circuit) and there is no connection between the CA1 signal path and the main signal path. Alternatively, when the control signal "S1" is a logic-high voltage level, the switch 442 is turned on (i.e. closed) and a connection between the CA1 signal path and the main signal path is established. This operation of the S(n) control signals is the same for any additional CA signal paths that may be utilized. For example, if the control signal $S_n$ is a logic-high voltage level, the switch 484 is turned on (i.e. closed) and a connection between the $CA_n$ signal path and the main signal path is established.

The control signals "SE(n)" are generated by the controller 308. The control signals SE(n) are coupled to control switches determine input voltages to the gate terminals of switches that connect the CA signal paths to their associated output load. For example, the control signal SE1 coupled to control the switch 462 to determine the voltage level input to the gate terminal 460 of switch 432. When the control signal "SE1" is a logic-low voltage level, zero volts are input to the gate terminal 460 to turn off the switch 432 (e.g., open circuit) and the path between the CA1 signal path and the output load 434 is opened. Alternatively, when the control signal "SE1" is a logic-high voltage level, vbc volts are input to the gate terminal 460 of the switch 432 (e.g., closed circuit) and the path between the CA1 signal path and the output load 434 is opened. The control signals SE(n) operate to control other corresponding switches in any additional CA signal paths in a similar manner.

First Operating Mode—Main Load Only

It may be advantageous to couple the input signal 406 to only the main output load 420 when performing carrier aggregation. To couple the input signal 406 to only the main load 420, one or both of the first 414 and second 436 cascode amplifiers is turned on by the operation of the Sa and Sb control signals. Furthermore, the control signals SE(n) are set such that zero volts are input to the gate terminals of the associated (T5(n)) switches, thereby opening those switches to prevent coupling of the input signal 406 to the other CA loads. Turning on one or the other of the first 414 and the second 436 cascode amplifiers will set selected gain levels. Turning on both the first 414 and the second 436 cascode amplifiers will maximize the gain applied to the input signal 406 before it is coupled to the main load 420.

Second Operating Mode—Main Load and One or More CA Loads

It may be advantageous to couple the input signal 406 to the main output load 420 and one or more CA loads when performing carrier aggregation. For example, the main load operates to demodulate a first carrier signal and the one or more additional CA loads operate to demodulate one or more additional carrier signals. To couple the input signal 406 to the main load 420, at least one of the first 414 and second 436 cascode amplifiers is turned on by the operation of the Sa and Sb control signals. To couple the input signal to one or more CA loads, the control signals SE(n) are set such that vbc volts are input to the gate terminals of the associated (T5(n)) switches, thereby closing those switches to allow coupling of the input signal 406 to the associated CA loads. Turning on both the first 414 and the second 436 cascode amplifiers will maximize the gain applied to the input signal 406 before it is coupled to the main load 420.

Third Operating Mode—First Load Connected to Main Load

It may be advantageous to couple the first output load 434 to the main output load 420 when performing carrier aggregation. To couple the first output load 434 to the main output load 420 the control signals S1 and SE1 are set such that both the first switch 432 and the second switch 442 are closed. In the event that either the first 432 or the second 442 switch is open, the first output load 434 will be disconnected from the main output load 420. When coupling the first output load 434 to the main output load 420, it may be advantageous to decouple the input signal from the main output load 420. In order to prevent coupling of the input signal to the main output load 420, the first 414 and second 436 cascode amplifiers are turned off.

FIG. 4 further illustrates how the switch 474 and the switch 484 can be operated in a similar fashion to couple the $N^{th}$ output load 478 to the main output load 420. Thus, utilizing the exemplary embodiment illustrated in FIG. 4, the SARC 306 can amplify and route signals to and between N output loads. The amplification and routing of the signals is dynamically controlled by controller 308 for each path as described above.

When routing the RF input signal to the CA loads, the output of transistor T1 is used by transistors T2(n) to generate current signals that are coupled to CA(n) outputs for intra-carrier aggregation mode. The voltage gain at the drain of transistor T1 will be "Q_match*(gm_T1/gm_T3)" for a common source LNA topology. For a common source amplifier the Q of the input network is defined by the ratio of reactive impedance and resistive impedance.

The SARC 306, shown in FIG. 4, provides good linearity for each carrier aggregation (CA) path. The linearity for each carrier aggregation path is close to the linearity of the main path. The linearity of each carrier aggregation path is set by the current and voltage gain of transistor T3 and the current and voltage gain of transistor T2. The first cascode amplifier is adjusted depending on whether operating in carrier aggregation mode or in a non-carrier aggregation mode so to reduce the noise contribution and improve linearity during operation. It should also be noted that the front end architecture shown in FIG. 4 can be implement on one or more integrated circuits. For example, in an exemplary embodiment, components on one side of the circuit boundary 494 can be implemented in a first integrated circuit and components on the opposite side of the circuit boundary 494 can be implemented in a second integrated circuit. Thus, the exemplary embodiments can be implemented in any number of integrated circuits.

Figure 5:
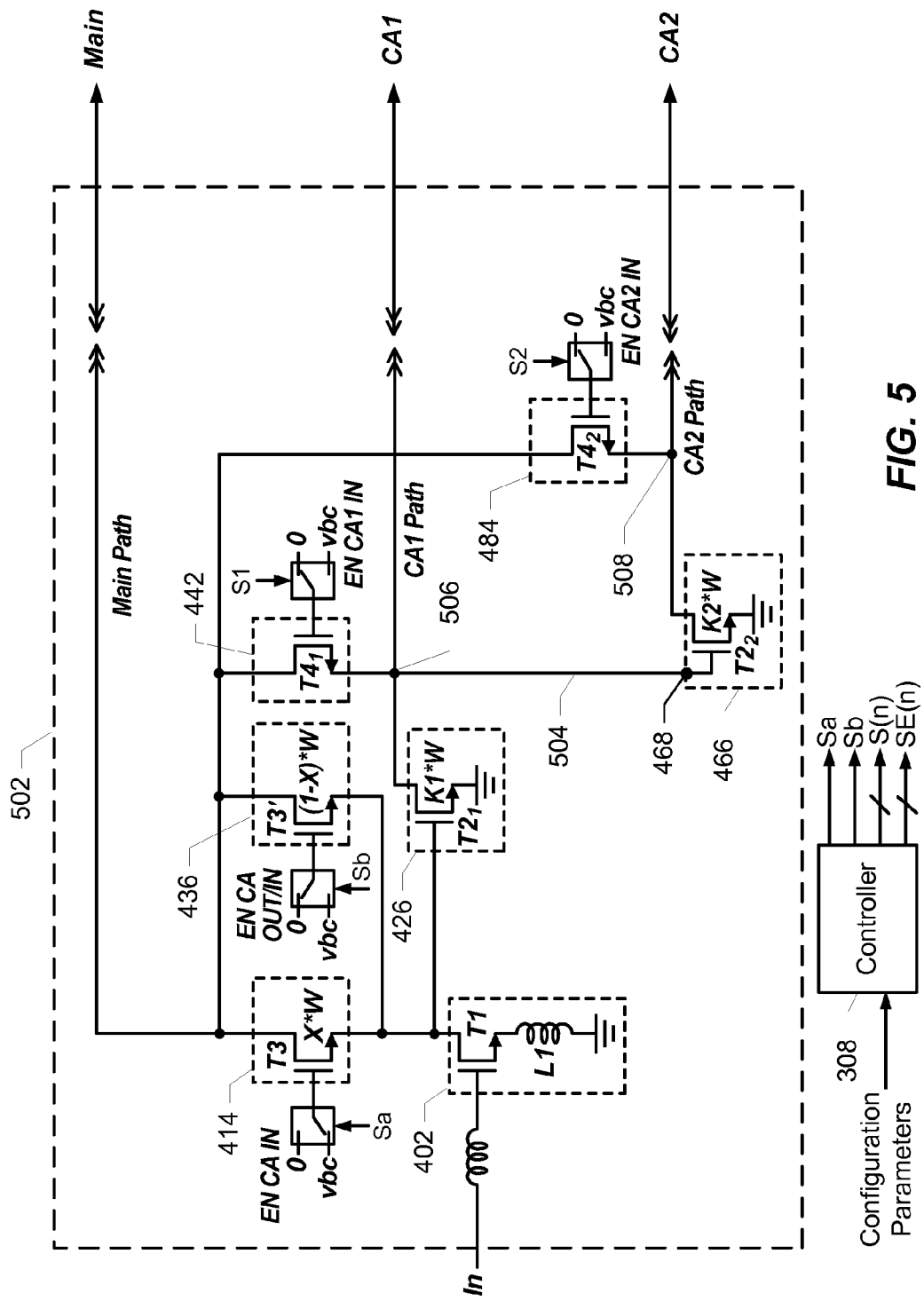
FIG. 5 shows a detailed alternative exemplary embodiment of the front end architecture shown in FIG. 3.

FIG. 5 shows a detailed alternative exemplary embodiment of the front end architecture shown in FIG. 3 comprising SARC 502. The SARC 502 includes circuit components identical to the SARC 306 shown in FIG. 4, but connected in a different configuration. In the SARC 502, the gate terminal 468 of the third common source amplifier 466 is coupled to the first CA1 path at terminal 506 by signal line 504. Thus, the third common source amplifier 466 receives its input from the output of the second common source amplifier 426. As a further extension, a subsequent common source amplifier associated with another CA signal path can be connected to the CA2 signal path at terminal 508. By chaining the outputs of the common source amplifiers in this fashion any number of CA signal paths can be generated. It should also be noted that the second 426 and third 466 common source amplifiers are also configured without degeneration inductors, which reduces the circuit area requirements of the SARC 502.

Figure 6:
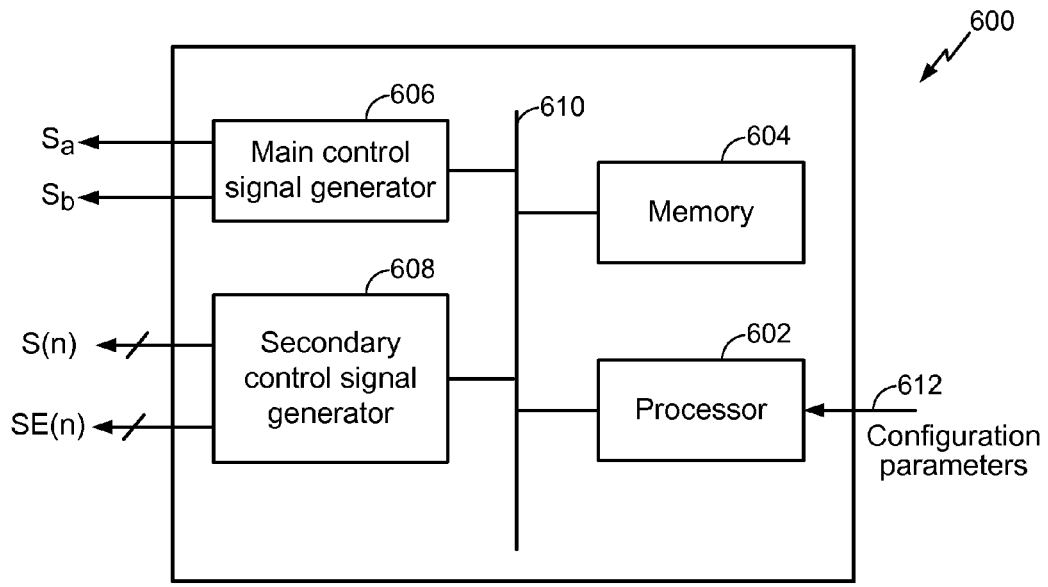
FIG. 6 shows an exemplary embodiment of a controller for use with the front end architecture shown in FIG. 4.

FIG. 6 shows an exemplary embodiment of a controller 600 for use with the front end architecture shown in FIG. 4. In an exemplary embodiment, the controller 600 is suitable for use as the controller 308 shown in FIG. 4 or FIG. 5. The controller 600 includes processor 602, memory 604, main control signal generator 606, and secondary control signal generator 608 all couple to communicate over bus 610.

The processor 602 comprises at least one of a CPU, processor, gate array, hardware logic, discrete circuits, memory elements, and/or hardware executing software. The processor 602 operates to control the other functional elements of the controller 600 using the bus 610. The processor 602 is also configured to communicate with other entities at the wireless device using the communication line 612. For example, the processor 602 may receive instructions, control information, configuration information, data, measurements or other information over the communication line 612.

The memory 604 comprises any suitable memory or storage device that allows for storing, retrieving, and maintaining instructions and/or data associated with the operation of the controller 600. In an exemplary embodiment, the memory 604 stores algorithm instructions that can be executed by the processor 602 to perform the functions of signal amplification and routing as described herein.

The main control signal generator 606 comprises hardware, such as amplifiers, buffers, registers, gates, analog to digital converters, digital to analog converters, or any other suitable hardware or discrete components and/or hardware executing software that operates to generate the main control signals Sa and Sb. In an exemplary embodiment, the processor 602 operates to determine a configuration of the SARC 306 based on configuration parameters received over the signal line 612. The processor then controls the main control signal generator 606 using the bus 610 to generate and output the Sa and Sb control signals to obtain the desired configuration. In an exemplary embodiment, the Sa and Sb control signals are set to enable, disable, or bias any of the transistor devices to which they are coupled. For example, the Sa and Sb control signals may operate to bias the transistor devices to any desired bias setting or for DC coupling.

The secondary control signal generator 608 comprises hardware, such as amplifiers, buffers, registers, gates, analog to digital converters, digital to analog converters, or any other suitable hardware or discrete components and/or hardware executing software that operates to generate the secondary control signals S(n) and SE(n). In an exemplary embodiment, the processor 602 operates to determine a configuration of the SARC 306 based on configuration parameters received over the signal line 612. The processor then controls the secondary control signal generator 608 to generate the S(n) and SE(n) control lines to obtain the desired configuration. In an exemplary embodiment, the S(n) and SE(n) control signals are set to enable, disable, or bias any of the transistor devices to which they are coupled. For example, the S(n) and SE(n) control signals may operate to bias the transistor devices to any desired bias setting or for DC coupling.

In an exemplary embodiment, the processor 602 executes code stored in memory 604 to control the main 606 and secondary 608 control signal generators to generate control signals to obtain a desired signal routing configuration.

It should be noted that the controller 600 represents just one implementation and that other implementations are possible. For example, the controller 600 may be implemented in discrete logic that eliminates the need for a processor or memory devices. In another implementation, the functions and/or implementations of the controller 600 are incorporated or integrated into a baseband processor or other entity at the wireless device.

Figure 7:
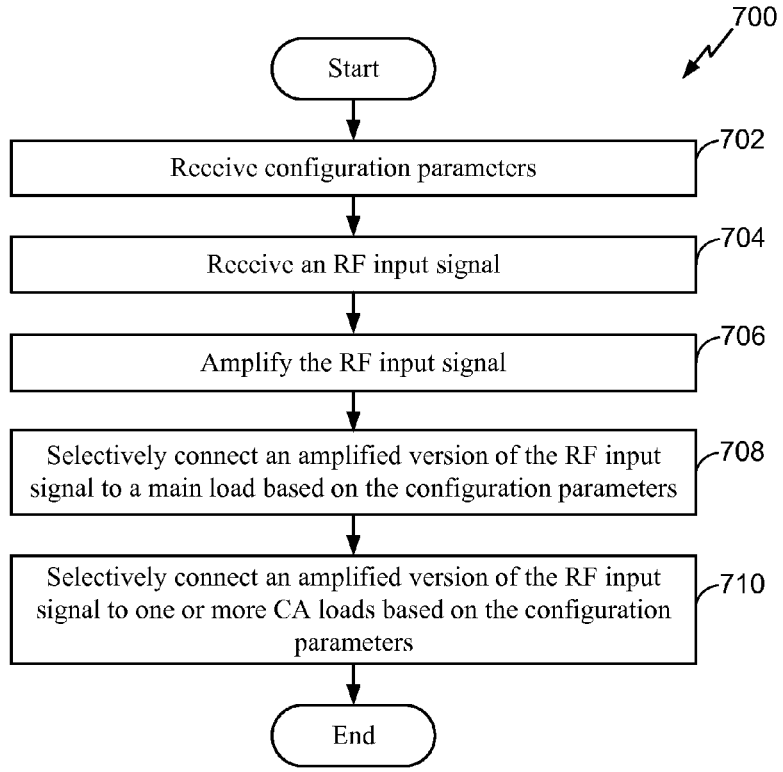
FIG. 7 shows exemplary operations performed by an exemplary embodiment of a front end architecture to provide RF signal amplification and routing in a receiver front end.

FIG. 7 shows exemplary operations 700 for RF signal amplification and routing in a receiver front end. For example, in an exemplary embodiment, the SARC 306 and controller 308 shown in FIG. 4 are configured to perform the operations 700 to obtain desired RF signal amplification and routing in a receiver front end. In an exemplary embodiment, the controller 308 is the controller 600 and the processor 602 execute instructions stored in the memory 604 to control the components of the controller 600 to control the SARC 306 to perform the operations describe below.

At block 702, configuration parameters are received. For example, the configuration parameters are received by the processor 602 over the communication line 612 from an entity at the wireless device. The configuration parameters describe how received RF signals are to be amplified and routed to the main and carrier aggregation loads in the receiver. In an exemplary embodiment, the processor 602 operates to store the configuration parameters in the memory 604.

At block 704, an RF signal is received. For example, an RF signal is received by antenna 302 and passes through matching circuit 304 before flowing on the input line 406 shown in FIG. 4.

At block 706, the received RF signal is amplified. In an exemplary embodiment, the received RF signal is input to the first common source amplifier 402. The first common source amplifier 402 includes the degeneration inductor 410. An amplified version of the received RF signal appears at the drain terminal 412. Thus, the received RF signal is amplified by a common source amplifier with source degeneration to generate the amplified version of the received RF signal.

At block 708, the amplified version of the received RF signal is selectively connected to a main load based on the configuration parameters. In an exemplary embodiment, the processor 602 processes the configuration parameters to determine the control signal settings that are needed to obtain the desired configuration. The processor 602 communicates the control signal settings to the main control signal generator 606 using the bus 610. The main control signal generator 606 operates to generate and output the Sa and Sb control signals to obtain the desired signal amplification and routing to the main load identified by the configuration parameters. For example, if the Sa control signal is a logic high (1) and the Sb control signal is a logic low (0), then the amplifier 414 provides cascode amplification to amplify the signal at terminal 412 to generate an amplified output signal at terminal 418 that is input to the main load. In various exemplary embodiments, the main control signal generator 606 generates the control signals Sa and Sb as provided in table 800 shown in FIG. 8 to selectively connect the amplified RF signal to the main load.

At block 710, the amplified version of the received RF signal is selectively connected to one or more CA loads based on the configuration parameters. In an exemplary embodiment, the processor 602 processes the configuration parameters to determine the control signal settings that are needed to obtain the desired configuration. The processor 602 communicates the control signal settings to the secondary control signal generator 608 using the bus 610. The secondary control signal generator 608 operates to generate and output the S(n) and SE(n) control signals to obtain the desired signal amplification and routing to one or more CA loads as identified by the configuration parameters. For example, if the SE1 control signal is a logic high (1), then the switch 432 is enabled to input the amplified signal at terminal 430 to the first CA load 434. As a result, the received RF signal is amplified and routed to selected CA loads based on the SE(n) control signals to obtain the desired signal amplification and routing configuration. When amplifying and routing the received RF signal to the selected CA loads, the additional common source amplifiers (T2(n)) (e.g., amplifiers 426 through 466) do not include (or are configured without) source degeneration inductors, which results in reduced circuit area when compared to conventional systems.

Accordingly, the SARC 306 and the controller 308 are configured to perform the operations described above. It should be noted that the operations 700 are exemplary and that minor changes, modifications, rearrangements and other changes to the operations 700 are within the scope of the exemplary embodiments.

Figures 8, 9:
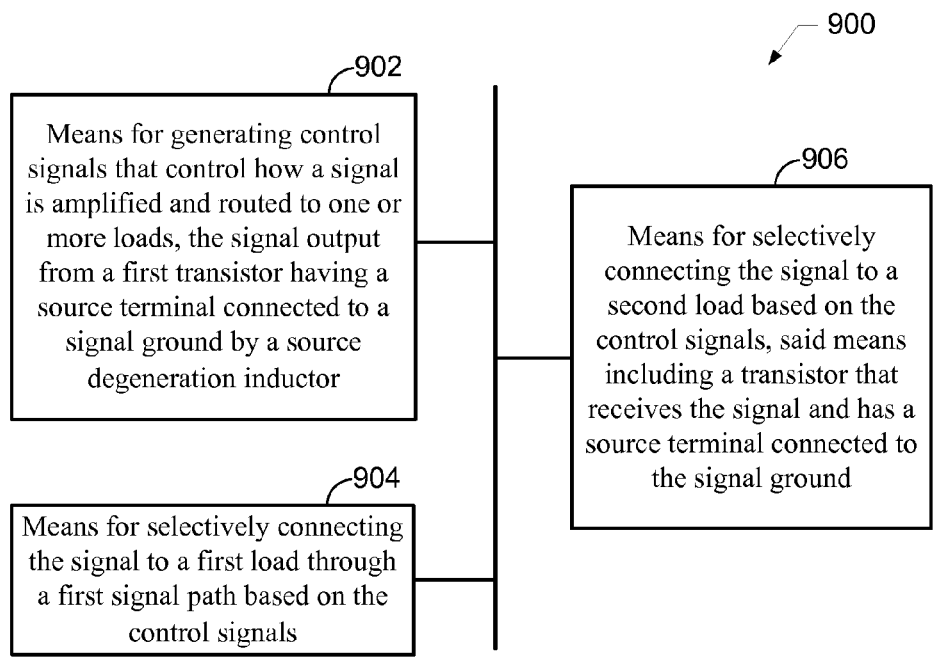
FIG. 8 shows an exemplary embodiment of a table showing control signal settings for various signal amplification and routing configurations for use with the front end architectures shown in FIG. 4 and FIG. 5.
FIG. 9 shows an exemplary embodiment of an apparatus for RF signal amplification and routing in a carrier aggregation receiver.

FIG. 8 shows an exemplary embodiment of a table 800 showing control signal settings for various amplification and routing configurations for use with the front end architecture shown in FIG. 4. The table 800 includes configuration information 802, control signal Sa settings 804, control signal Sb settings 806, control signal S1 settings 808 and control signal SE1 settings 810. For clarity, the table 800 shows signal settings for S1 and SE1 signals only. It should be noted that similar settings can be used for the control signals S(n) and SE(n) to connect additional loads to the input signal or the main load. In various exemplary embodiments, the controller 600 operates to generate and output the control signals shown to obtain the selected configurations.

In one mode of operation to route an input signal only to the main load, control signal SA is set to a logic high voltage, control signal SB is set to a logic high voltage, control signal S1 is set to a logic low voltage, and control signal SE1 is set to a logic low voltage.

In another mode of operation to route an input signal to both the main load and the first load (CA1), control signal SA is set to a logic low voltage, control signal SB is set to a logic low voltage, control signal S1 is set to a logic low voltage, and control signal SE1 is set to a logic high voltage.

In still another mode of operation to route the first load signal to the main load, control signal SA is set to a logic low voltage, control signal SB is set to a logic low voltage, control signal S1 is set to a logic high voltage, and control signal SE1 is set to a logic low voltage.

FIG. 9 shows an exemplary embodiment of an apparatus 900 for RF signal amplification and routing in a carrier aggregation receiver. In an exemplary embodiment, the apparatus 900 is suitable for use as the SARC 306 shown in FIG. 4. The apparatus 900 includes a first means 902 for generating control signals that control how a signal is to be amplified and routed to one or more loads, the signal output from a first transistor having a source terminal connected to a signal ground by a source degeneration inductor, which in an exemplary embodiment comprises the controller 600 shown in FIG. 6 and the amplifier 402 shown in FIG. 4. The apparatus 900 also comprises a second means 904 for selectively connecting the signal to a first load through a first signal path based on the control signals, which in an exemplary embodiment comprises the transistors T3 and T3' shown in FIG. 4. The apparatus 900 also comprises a third means 906 for selectively connecting the signal to a second load based on the control signals, said means including a transistor that receives the signal and has a source terminal connected to the signal ground, which in an exemplary embodiment comprises the transistor $T2_1$.

The exemplary embodiments of a Signal Amplifier and Routing Circuit (SARC) described herein may be implemented on an IC, an analog IC, an RFIC, a mixed-signal IC, an ASIC, a printed circuit board (PCB), an electronic device, etc. The SARC may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing a Signal Amplifier and Routing Circuit (SARC) described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but the disclose is to be accorded the widest scope consistent with the principles and novel features disclosed herein.

What is claimed is:

1. An apparatus comprising:
    a first transistor having a gate terminal configured to receive an input signal, a drain terminal configured to output an amplified signal, and a source terminal connected to a signal ground by a source degeneration inductor;
    a second transistor having a source terminal connected to the drain terminal of the first transistor and a drain terminal connected to a first load; and
    a third transistor having a gate terminal connected to the drain terminal of the first transistor, a drain terminal connected to a second load and a source terminal connected to a signal ground,
    wherein the drain terminal of the third transistor is selectively connected to the first load through a switch.

2. The apparatus of claim 1, further comprising a fourth transistor having a source terminal connected to the drain terminal of the first transistor and a drain terminal connected to the first load, the fourth transistor configured to conduct an amount of current that is identical to or different from the second transistor.

3. The apparatus of claim 2, the fourth transistor selectively enabled or biased for DC coupling by a control signal to control current to the first load.

4. The apparatus of claim 1, further comprising one or more additional transistors having one or more gate terminals, respectively, connected to the drain terminal of the first transistor, one or more drain terminals connected to one or more loads, respectively, and one or more source terminals connected to the signal ground.

5. The apparatus of claim 4, the one or more drain terminals selectively connected to the one or more loads through one or more switches.

6. The apparatus of claim 5, the one or more switches selectively enabled by one or more control signals.

7. The apparatus of claim 4, the drain terminals of the one or more additional transistors selectively connected to the first load through one or more switches.

8. The apparatus of claim 7, the one or more switches selectively enabled by one or more control signals.

9. The apparatus of claim 1, the second transistor being selectively enabled or biased for DC coupling by a control signal.

10. The apparatus of claim 1, the drain terminal of the third transistor selectively connected to the second load through a switch.

11. The apparatus of claim 10, the switch selectively enabled or biased for DC coupling by a control signal.

12. The apparatus of claim 1, the switch selectively enabled by a control signal.

13. The apparatus of claim 1, further comprising a controller to generate control signals to selectively enable the second and third transistors or to bias the second and third transistors for DC coupling.

14. The apparatus of claim 1, the apparatus configured to perform configurable amplification and routing of carrier aggregation signals in a receiver.

15. The apparatus of claim 1, the apparatus formed on an integrated circuit.

16. An apparatus comprising:
    means for generating control signals that control how a signal is amplified and routed to one or more loads, wherein the signal is output from a first transistor having a source terminal connected to a signal ground by a source degeneration inductor;
    means for selectively connecting the signal to a first load through a first signal path based on the control signals; and
    means for selectively connecting the signal to a second load based on the control signals, said means including a transistor that receives the signal and has a source terminal connected to the signal ground.

17. The apparatus of claim 16, further comprising means for selectively connecting the signal to the first load through a second signal path based on the control signals, the second path configured to conduct an amount of current that is identical to or different from the first signal path.

18. The apparatus of claim 16, further comprising means for selectively connecting the signal to one or more additional loads through one or more additional signal paths based on the control signals, said means including one or more additional transistors connected to receive the signal and having one or more additional source terminals connected to the signal ground.

19. The apparatus of claim 18, further comprising means for selectively connect the one or more additional signal paths to the first signal path based on the control signals.

* * * * *